(12) United States Patent
Li et al.

(10) Patent No.: US 12,500,116 B2
(45) Date of Patent: Dec. 16, 2025

(54) METHOD FOR MAKING DEEP TRENCH ISOLATION OF CIS DEVICE, AND SEMICONDUCTOR DEVICE STRUCTURE

(71) Applicants: Hua Hong Semiconductor (Wuxi) Limited, Wuxi (CN); Shanghai Huahong Grace Semiconductor Manufacturing Corporation, Shanghai (CN)

(72) Inventors: Jialong Li, Wuxi (CN); Peng Huang, Wuxi (CN); Xiao Fan, Wuxi (CN); Wensheng Qian, Wuxi (CN)

(73) Assignee: Hua Hong Semiconductor (Wuxi) Limited, Shanghai (CN)

( * ) Notice: Subject to any disclaimer, the term of this patent is extended or adjusted under 35 U.S.C. 154(b) by 771 days.

(21) Appl. No.: 17/577,194

(22) Filed: Jan. 17, 2022

(65) Prior Publication Data
US 2022/0230909 A1 Jul. 21, 2022

(30) Foreign Application Priority Data
Jan. 20, 2021 (CN) .......................... 202110075783.X

(51) Int. Cl.
*H01L 21/762* (2006.01)
*H10F 39/00* (2025.01)

(52) U.S. Cl.
CPC .. *H01L 21/76224* (2013.01); *H01L 21/76202* (2013.01); *H10F 39/014* (2025.01); *H10F 39/807* (2025.01)

(58) Field of Classification Search
CPC . H01L 21/76; H01L 21/762; H01L 21/76224; H01L 21/76227; H01L 27/14689; H01L 27/1463; H01L 21/763; H01L 21/76221; H01L 21/76205; H01L 21/76202; H01L 21/76237; H10F 39/014; H10F 39/807; H10F 39/026
See application file for complete search history.

(56) References Cited

U.S. PATENT DOCUMENTS 11,049,957 B1 * 6/2021 Yoo ...................... H01L 29/7835
2016/0163749 A1 * 6/2016 Yang .................... H10D 86/201
257/446

\* cited by examiner

*Primary Examiner* — Julio J Maldonado
*Assistant Examiner* — Stanetta D Isaac
(74) *Attorney, Agent, or Firm* — Harris Beach Murtha Cullina PLLC

(57) ABSTRACT

A method for making a deep trench isolation of a CIS device includes: growing a first epitaxial layer on a substrate; forming a hard mask layer on the first epitaxial layer; performing photolithography and etching processes to form deep trenches arranged longitudinally and transversely in the first epitaxial layer; forming a second epitaxial layer in the deep trenches; performing a thermal oxidation process to form a first oxide layer on the surface of the second epitaxial layer; completely filling the deep trenches with polysilicon; performing a back-etching process to expose sidewalls of the first oxide layer in the deep trenches; forming a second oxide layer on the top of the polysilicon; removing the hard mask layer and the first oxide layer above the second oxide layer; rapidly growing a third epitaxial layer; and performing a CMP process to form a deep trench isolation on the substrate.

6 Claims, 6 Drawing Sheets

METHOD FOR MAKING DEEP TRENCH ISOLATION OF CIS DEVICE, AND SEMICONDUCTOR DEVICE STRUCTURE

CROSS-REFERENCES TO RELATED APPLICATIONS

This application claims the priority to Chinese patent application No. CN 202110075783.X filed at CNIPA on Jan. 20, 2021, and entitled "METHOD FOR MAKING DEEP TRENCH ISOLATION OF CIS DEVICE, AND SEMICONDUCTOR DEVICE STRUCTURE", the disclosure of which is incorporated herein by reference in entirety.

TECHNICAL FIELD

The present disclosure relates to the field of semiconductor manufacturing, in particular to a method for making a deep trench isolation of a CIS device, and a semiconductor device structure.

BACKGROUND

A CIS (CMOS Image Sensor) is a device that converts optical signals into electrical signals.

The light sensitivity of CIS devices is related to the size of a pixel region. The space of photodiodes is expanded vertically to improve the light sensitivity in a small pixel region. A method known to the inventors, in a CIS device manufacturing process, a pixel region is defined by a photolithography process, and then the pixel region is formed by an ion implantation process.

However, the inventors realized that the photolithography process is limited by the depth-to-width ratio of the photoresist and the ion implantation process is limited by ion implantation depth and concentration during a small pixel region manufacturing process.

SUMMARY

According to some embodiments in this application, a method for making a deep trench isolation of a CIS device is disclosed in the following steps: growing a first epitaxial layer on a substrate, and the conductive type of the first epitaxial layer being N type; forming a hard mask layer on the surface of the first epitaxial layer; performing photolithography and etching processes to form deep trenches arranged longitudinally and transversely in the first epitaxial layer; forming a second epitaxial layer in the deep trenches, sidewalls and bottoms of the deep trenches being completely covered by the second epitaxial layer, and the conductive type of the second epitaxial layer being P type; performing a thermal oxidation process to form a first oxide layer with a predetermined thickness on the surface of the second epitaxial layer in the deep trenches; completely filling the deep trenches with a polysilicon; performing a back-etching process to the substrate to expose sidewalls of the first oxide layer in the deep trenches; forming a second oxide layer on the top of the polysilicon in the deep trenches; removing the hard mask layer on the surface of the substrate and the first oxide layer above the second oxide layer; rapidly growing a third epitaxial layer, the third epitaxial layer covering tops of the deep trenches, and the conductive type of the third epitaxial layer being P type; performing a CMP process to form a deep trench isolation on the substrate.

A semiconductor device structure is manufactured in a process with the CIS devices.

Figure 1:
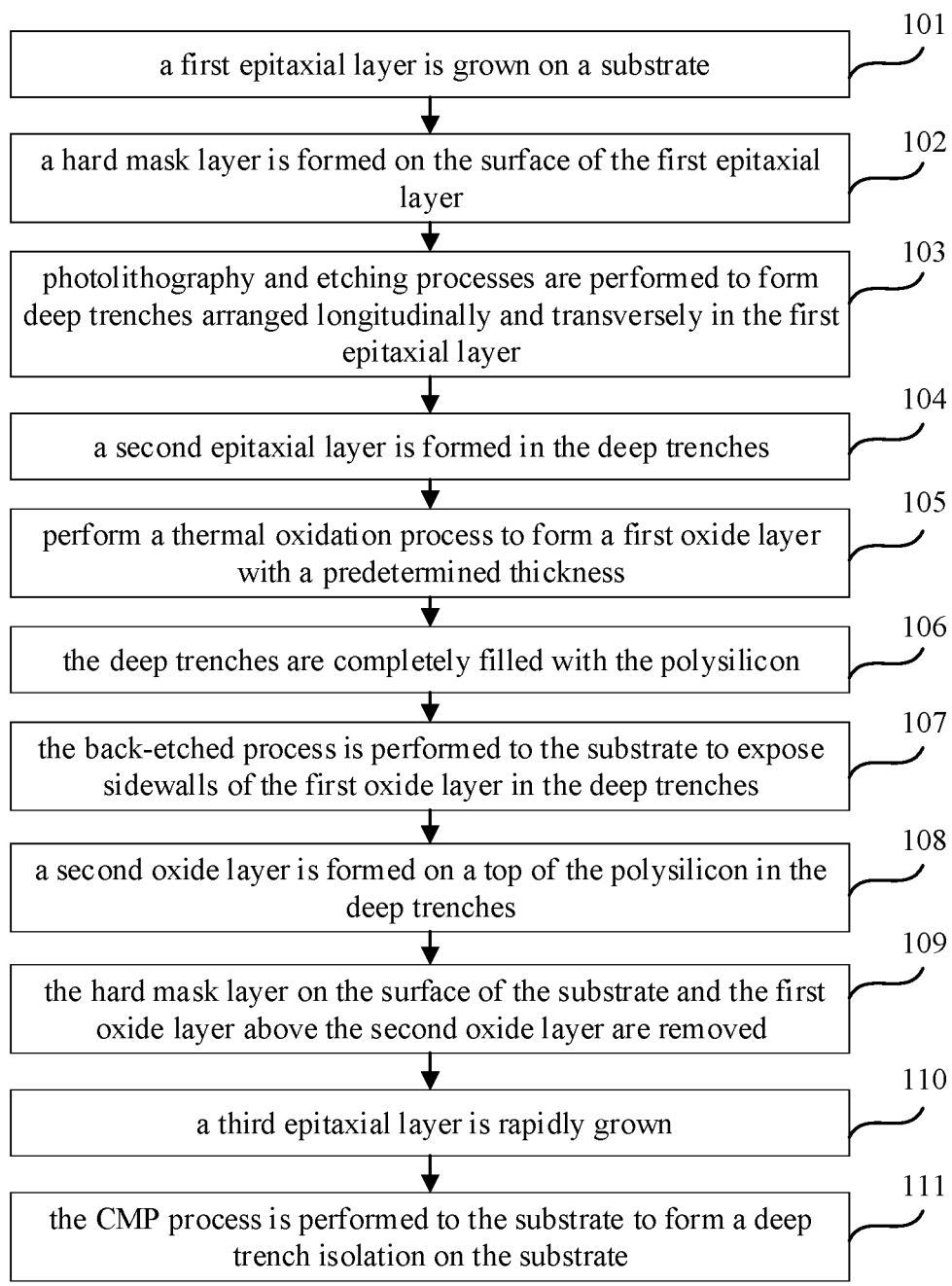
FIG. 1 is a flowchart of a method for making a deep trench isolation of a CIS device, according to one or more embodiments of the present application.

Reference numbers in the drawings are listed in the following:
11: substrate; 12: first epitaxial layer; 13: hard mask layer; 14: deep trench; 15: transverse deep trench; 16: longitudinal deep trench; 17: cross region of transverse deep trench and longitudinal deep trench; 18: second epitaxial layer; 19: first oxide layer; 21: polysilicon; 22: second oxide layer; 23: third epitaxial layer.

DETAILED DESCRIPTION

The technical solutions in this application will be clearly and completely described below with reference to the drawings. Obviously, the described embodiments are part of the embodiments of the application, instead of all them. Based on the embodiments in the present application, all other embodiments obtained by one skilled in the art without contributing any inventive labor shall fall into the protection scope of the present application.

In the description of this application, it should be noted that the orientation or positional relationship indicated by the terms "center", "upper", "lower", "left", "right", "vertical", "horizontal", "inside", "outside", or the like is based on the orientation or positional relationship shown in the drawings, is only for the convenience of describing this application and simplified description, and does not indicate or imply that the indicated device or element must have a specific orientation or be configured and operated in a specific orientation. Therefore, the orientation or positional relationship should not be construed as limitations on the present application. In addition, the terms "first," "second," and "third" are used for descriptive purposes only and should not be construed to indicate or imply relative importance.

In the description of this application, it should be noted that the terms "installation", "connected", and "connection" should be understood in a broad sense, unless explicitly stated and defined otherwise, for example, they may be fixed connection or removable connection, or integral connection; can be mechanical or electrical connection; can be direct connection, or indirect connection through an intermediate medium, or the internal communication of two elements, and can be wireless or wired connection. For those of ordinary skill in the art, the specific meanings of the above terms in this application can be understood in specific situations.

In addition, the technical features involved in the different implementations of the present application described below can be combined with each other as long as they do not conflict with each other.

One or more embodiments of the present application provides a method for making a deep trench isolation of a CIS device, including the following steps illustrated in FIG. 1.

In step 101, a first epitaxial layer is grown on a substrate.

The first epitaxial layer is a first conductive type, and the conductive type of the first epitaxial layer is N type.

Figure 2:
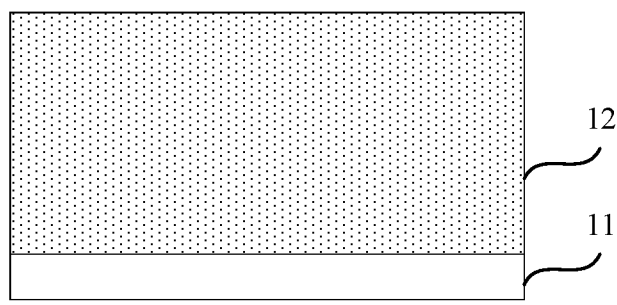
FIG. 2 shows the device cross sectional view after the first epitaxial layer is formed on the substrate.

Referring to FIG. 2, a first epitaxial layer 12 is grown on a substrate 11.

The thickness and doping concentration of the first epitaxial layer are determined according to the actual situation, which are not limited in the embodiments of the present application.

In step 102, a hard mask layer is formed on the surface of the first epitaxial layer.

In some embodiments, a hard mask is deposited by a CVD process, and the hard mask layer is used as a block layer for the etching processes.

Figure 3:
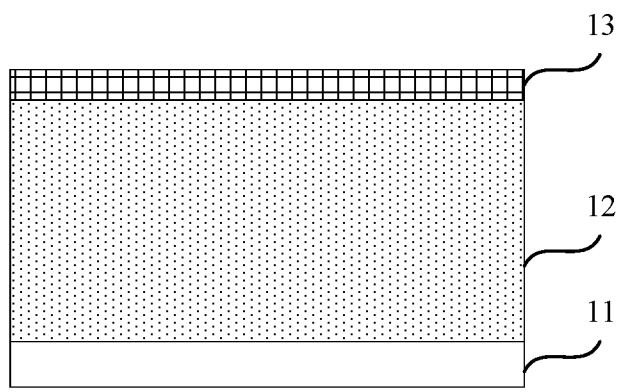
FIG. 3 shows the device cross sectional view after the hard mask is formed on the device.

Referring to FIG. 3, a hard mask layer 13 is formed on the surface of the first epitaxial layer 12.

In step 103, photolithography and etching processes are performed to form deep trenches arranged longitudinally and transversely in the first epitaxial layer.

The photoresist is coated on the surface of the hard mask layer, a mask with deep trench patterns is used for the exposure process, after development, the mask patterns are copied into the photoresist layer, the hard mask layer is etched by using the photoresist layer as a mask to copy the deep trench patterns into the hard mask layer, the photoresist is removed after the etching process of the hard mask layer, and then the first epitaxial layer is etched by using the hard mask layer as a mask, and thus deep trenches arranged longitudinally and transversely are formed in the first epitaxial layer.

Figure 4:
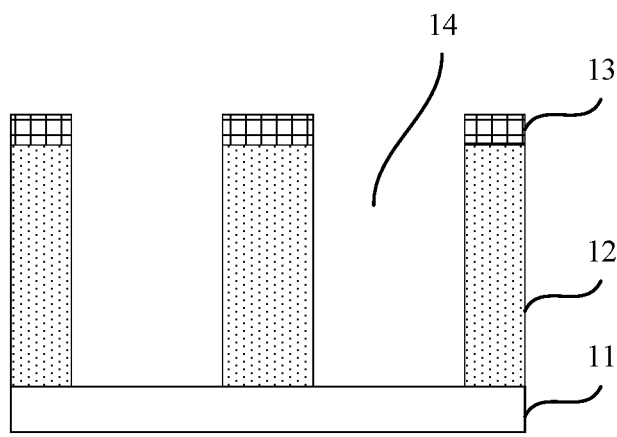
FIG. 4 shows the device cross sectional view after deep trenches formed in the first epitaxial layer, according to one or more embodiments of the present application.
Figure 5:
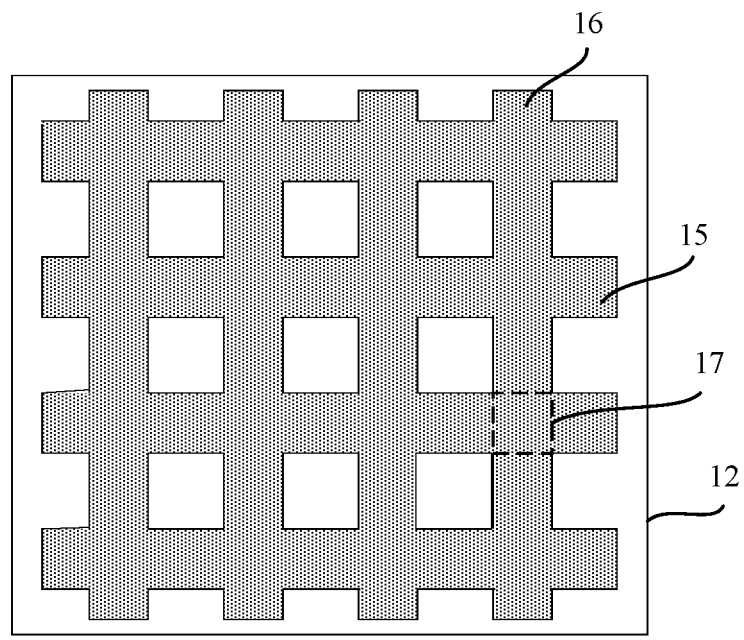
FIG. 5 shows the device top view after deep trenches formed in the first epitaxial layer, according to one or more embodiments of the present application.

Referring to FIG. 4, deep trenches 14 are formed in the first epitaxial layer 12. Referring to FIG. 5, from the top view of the substrate, the deep trenches formed in the first epitaxial layer 12 crisscross, and the transverse deep trenches 15 and the longitudinal deep trenches 16 form cross regions 17.

The number of deep trenches is determined according to the actual situation, and the depth of the deep trenches is equal to the thickness of the first epitaxial layer.

The deep trenches in the horizontal direction are parallel to each other, and the deep trenches in the vertical direction are parallel to each other. In the horizontal or vertical direction, two adjacent deep trenches are separated by a predetermined distance. The predetermined distance is determined according to the manufacturing process requirement of the CIS device.

In step 104, a second epitaxial layer is formed in the deep trenches.

The second epitaxial layer is a second conductive type, and the conductive type of the second epitaxial layer is P type.

The second epitaxial layer grown in the deep trenches completely covers the sidewalls and the bottoms of the deep trenches, but the deep trenches are not completely filled with the second epitaxial layer.

Figure 6:
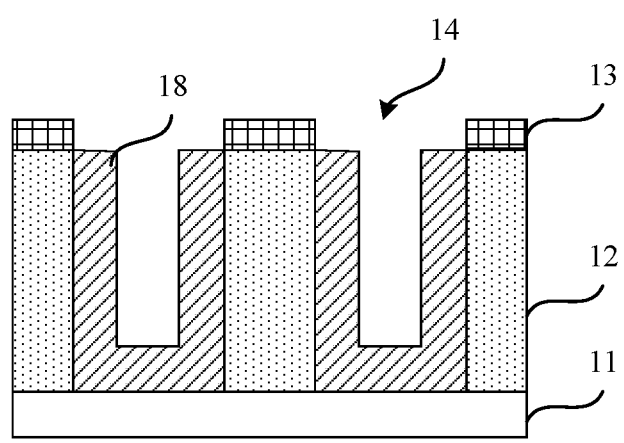
FIG. 6 shows the device cross sectional view after the second epitaxial layer is formed, according to one or more embodiments of the present application.

Referring to FIG. 6, the sidewalls and the bottoms of the deep trench 14 are completely covered by the second epitaxial layer 18, and there is still a gap in the deep trench 14.

The thickness of the second epitaxial layer is determined according to the actual situation, which is not limited in the embodiment of the present application.

In step 105, perform a thermal oxidation process to form a first oxide layer with a predetermined thickness.

The first oxide layer completely covers the second epitaxial layer.

Figure 7:
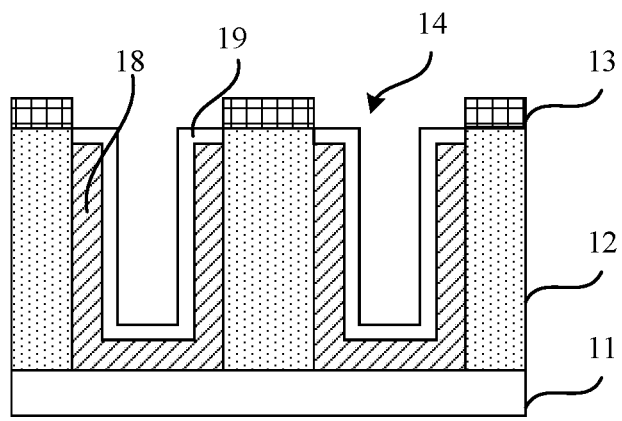
FIG. 7 shows the device cross sectional view after the first oxide layer is formed, according to one or more embodiments of the present application.

The thermal oxidation process is performed to the substrate, and the second epitaxial layer in the deep trenches is oxidized. Referring to FIG. 7, in the deep trenches 14, the first oxide layer 19 formed by the oxidation of the second epitaxial layer 18 completely covering the second epitaxial layer 18.

The predetermined thickness of the first oxide layer is determined according to the actual situation.

After the thermal oxidation process, the deep trenches have not been completely filled, that is, there is still a gap in the deep trenches.

In step 106, the deep trenches are completely filled with the polysilicon.

The polysilicon is deposited to completely fill the deep trenches. When the deep trenches are completely filled, there are excess polysilicon on the surface of the substrate. At this time, the cross regions of the transverse deep trenches and the longitudinal deep trenches are also completely filled with the polysilicon.

Figure 8:
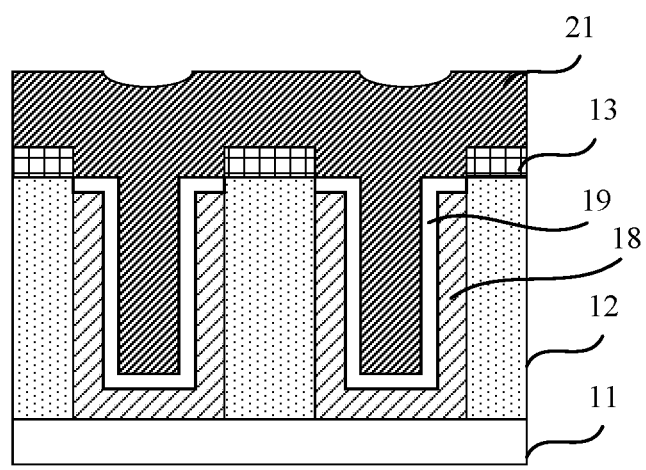
FIG. 8 shows the device cross sectional view after the polysilicon is deposited, according to one or more embodiments of the present application.

Referring to FIG. 8, the deep trenches are completely filled with the polysilicon 21, the first oxide layer 19 and the second epitaxial layer 18, and the top of the first epitaxial layer 12 is also covered by the polysilicon 21.

In step 107, the back-etched process is performed to the substrate to expose sidewalls of the first oxide layer in the deep trenches.

The substrate is back-etched to remove the polysilicon on the surface of the substrate and the polysilicon on upper portions in the deep trenches, and expose the sidewalls of the first oxide layer in the deep trenches.

Figure 9:
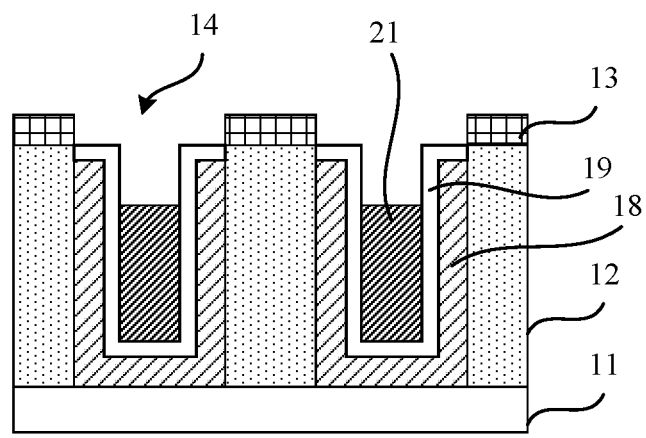
FIG. 9 shows the device cross sectional view after the back-etching process, according to one or more embodiments of the present application.

Referring to FIG. 9, the polysilicon above the first epitaxial layer 12 is removed, the polysilicon on the upper portions in the deep trenches 14 is also removed, and the sidewalls of the first oxide layer 19 in the deep trenches 14 are exposed. In each deep trench 14, the gap in the first oxide layer 19 is partially filled with the polysilicon 21.

In step 108, a second oxide layer is formed on a top of the polysilicon in the deep trenches.

In some embodiments, a second oxide layer is formed on a top of the polysilicon by the thermal oxidation process of the polysilicon.

Figure 10:
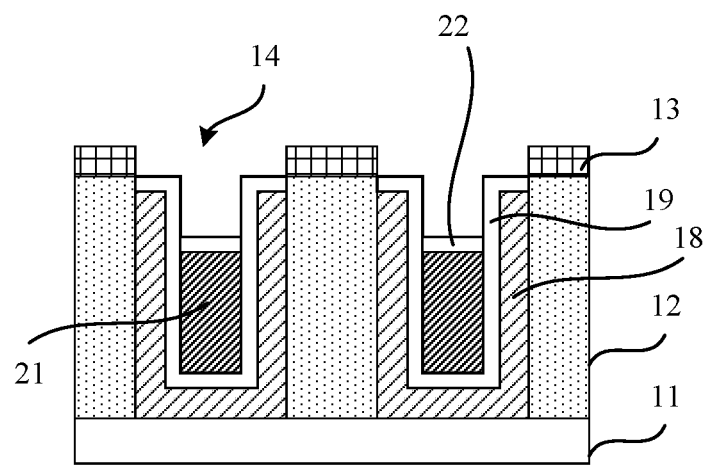
FIG. 10 shows the device cross sectional view after the second oxide layer is formed on the top of the polysilicon in the deep trenches, according to one or more embodiments of the present application.

The thermal oxidation process is performed to the polysilicon 21 in the deep trenches 14, referring to FIG. 10, a second oxide layer 22 on a top of the polysilicon 21 is formed in the deep trenches 14.

In step 109, the hard mask layer on the surface of the substrate and the first oxide layer above the second oxide layer are removed.

Figure 11:
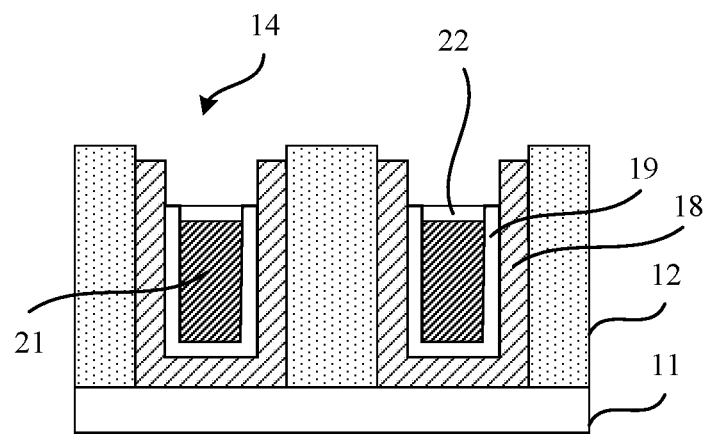
FIG. 11 shows the device cross sectional view after the hard mask layer and the first oxide layer above the second oxide layer are removed, according to one or more embodiments of the present application.

After the hard mask layer and the first oxide layer above the second oxide layer 22 in the deep trenches 14 are removed, referring to FIG. 11, there is no the hard mask layer on the surface of the first epitaxial layer 12; the height of the second oxide layer 22 is the same as the height of the first oxide layer 19; the sidewalls of the second epitaxial layer 18 and the sidewalls of the deep trenches 14 are exposed.

In step 110, a third epitaxial layer is rapidly grown.

The third epitaxial layer covers tops of the deep trenches.

The third epitaxial layer is the second conductive type, and the conductive type of the third epitaxial layer is P type.

The growth speed of the third epitaxial layer is higher than the growth speed of the second epitaxial layer.

Figure 12:
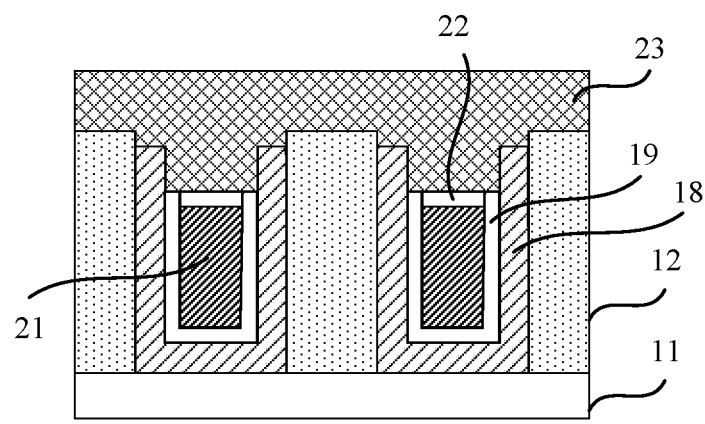
FIG. 12 shows the device cross sectional view, according to one or more embodiments of the present application.

Since the growth speed of the third epitaxial layer is faster, the third epitaxial layer fully fill the deep trenches, and the cross regions 17 of the longitudinal deep trenches and the transverse deep trenches, that is, to seal the cross regions of the trenches. Referring to FIG. 12, the third epitaxial layer 23 completely fills the gap in the deep trenches illustrated in FIG. 11.

In step 111, the CMP process is performed to the substrate to form a deep trench isolation on the substrate.

The surface of the substrate is not flat after the third epitaxial layer is formed, perform the CMP process to the surface of the substrate to remove the excess third epitaxial layer. After the CMP process is performed, a deep trench isolation of the CIS device is formed on the substrate, referring to FIG. 12.

In summary, by forming a first epitaxial layer on a substrate, forming deep trenches arranged longitudinally and transversely in the first epitaxial layer, forming a second epitaxial layer covering sidewalls and bottoms of the deep trenches in the deep trenches, oxidizing the second epitaxial layer to form a first oxide layer, filling the deep trenches with polysilicon, oxidizing the top of the polysilicon to form a second oxide layer, then removing the hard mask layer and the first oxide layer in a region above the second oxide layer in the deep trenches, rapidly growing a third epitaxial layer to seal tops of the deep trenches, the sealing defect at the top of the cross region of the deep trench has been overcome.

In some embodiments, the first conductive type is N-type, the second conductive type and the third conductive type are P-type; or, the first conducting type is P-type, the second conducting type and the third conducting type are N-type.

In some embodiments, the doping concentration of the third epitaxial layer is higher than the doping concentration of the second epitaxial layer.

In some embodiments, a doped epitaxial growth process is performed to form the second epitaxial layer on the sidewalls and bottoms of the deep trenches.

In some embodiments, wet etching processes are performed to remove the hard mask layer on the surface of the substrate and the first oxide layer higher than the second oxide layer in the deep trenches.

In some embodiments, the material of the hard mask layer is silicon nitride or silicon dioxide.

In some embodiments, the polysilicon filled in the deep trenches is doped polysilicon.

According to the conductive type of the second epitaxial layer and the third epitaxial layer, the doping type of the doped polysilicon is determined. For example, the conductive type of the second epitaxial layer and the third epitaxial layer is P-type, and the polysilicon filled the deep trenches is a P-type doped polysilicon.

One embodiment of the present application provides a semiconductor device structure. The semiconductor device structure is formed in the manufacturing process of the CIS device. FIG. 12 shows the device cross sectional view of the deep trench isolation, according to one or more embodiments of the present application.

The semiconductor device structure includes a substrate 11, and above the substrate 11 is a first epitaxial layer 12.

Deep trenches arranged longitudinally and transversely are formed in the first epitaxial layer 12, and each deep trench is completely filled with a second epitaxial layer 18, an oxide layer, a polysilicon 21 and a third epitaxial layer 23.

In each deep trench, an outer side of the polysilicon 21 is a first oxide layer 19, a top of the polysilicon 21 is covered by a second oxide layer 22, an outer side of the first oxide layer 19 is the second epitaxial layer 18, and the third epitaxial layer 23 completely covers the second epitaxial layer 18, the first oxide layer 19 and the second oxide layer 22.

Bottoms of the deep trenches are completely covered by the second extending layer 23.

The conductive type of the first epitaxial layer 12 is N type, and the conductive type of the second epitaxial layer 18 and the third epitaxial layer 23 is P type.

Each deep trench which is completely filled with the third epitaxial layer 23, the second epitaxial layer 18, the first oxide layer 19, the second oxide layer 22 and the polysilicon 21 is a deep trench isolation.

The cross regions of the longitudinal deep trenches and the transverse deep trenches are completely filled.

In some embodiments, the doping concentration of the third epitaxial layer is higher than the doping concentration of the second epitaxial layer.

In some embodiments, the polysilicon is doped polysilicon.

In some embodiments, the surface of the first epitaxial layer is covered by the third epitaxial layer.

The foregoing embodiments are merely for clear description of made examples, and are not limitations on the implementations. For those of ordinary skill in the art, other different forms of changes or modifications can be made on the basis of the above description. There is no need and cannot be exhaustive for all implementations. And, the obvious changes or modifications introduced thereby are still within the protection scope of this application.

What is claimed is:

1. A method for making a deep trench isolation of a CIS device, comprising:
   growing a first epitaxial layer on a substrate, and the conductive type of the first epitaxial layer being N type;
   forming a hard mask layer on the surface of the first epitaxial layer;
   performing photolithography and etching processes to form deep trenches arranged longitudinally and transversely in the first epitaxial layer;
   forming a second epitaxial layer in the deep trenches, sidewalls and bottoms of the deep trenches being completely covered by the second epitaxial layer, and the conductive type of the second epitaxial layer being P type;

performing a thermal oxidation process to form a first oxide layer with a predetermined thickness on the surface of the second epitaxial layer in the deep trenches;

completely filling the deep trenches with a polysilicon;

performing a back-etching process to the substrate to expose sidewalls of the first oxide layer in the deep trenches;

forming a second oxide layer on the top of the polysilicon in the deep trenches;

removing the hard mask layer on the surface of the substrate and the first oxide layer above the second oxide layer;

rapidly growing a third epitaxial layer, the third epitaxial layer covering tops of the deep trenches, and the conductive type of the third epitaxial layer being P type; and performing a CMP process to form a deep trench isolation on the substrate.

2. The method for making a deep trench isolation of a CIS device, according to claim 1, wherein the doping concentration of the third epitaxial layer is higher than the doping concentration of the second epitaxial layer.

3. The method for making a deep trench isolation of a CIS device, according to claim 1, wherein forming the second epitaxial layer in the deep trenches comprises:

performing a doped epitaxial growth process to grow a second epitaxial layer on the sidewalls and bottoms of the deep trenches.

4. The method for making a deep trench isolation of a CIS device, according to claim 1, wherein removing the hard mask layer on the surface of the substrate and the first oxide layer above the second oxide layer comprises:

performing wet etching processes to removing the hard mask layer on the surface of the substrate and the first oxide layer higher than the second oxide layer in the deep trenches.

5. The method for making a deep trench isolation of a CIS device, according to claim 1, wherein the material of the hard mask layer is silicon nitride or silicon dioxide.

6. The method for making a deep trench isolation of a CIS device, according to claim 1, wherein the polysilicon filled in the deep trenches is doped polysilicon.

* * * * *